Feb. 3, 1970 C. A. NEUGEBAUER ET AL 3,493,475

METHOD OF FORMING CRYOTRONS ON ROLLED ALUMINUM SUBSTRATES

Filed Feb. 13, 1967 2 Sheets-Sheet 1

Inventors:
Constantine A. Neugebauer,
John R. Rairden,
Reuben E. Joynson,
by [signature]
Their Attorney.

METHOD OF FORMING CRYOTRONS ON ROLLED ALUMINUM SUBSTRATES

Filed Feb. 13, 1967 2 Sheets-Sheet 2

Inventors:
Constantine A. Neugebauer,
John R. Rairden,
Reuben E. Joynson,
by John J. Kinane
Their Attorney.

United States Patent Office 3,493,475
Patented Feb. 3, 1970

3,493,475

METHOD OF FORMING CRYOTRONS ON ROLLED ALUMINUM SUBSTRATES

Constantine A. Neugebauer, Schenectady, John R. Rairden III, Niskayuna, and Reuben E. Joynson, Schenectady, N.Y., assignors to General Electric Company, a corporation of New York Filed Feb. 13, 1967, Ser. No. 615,434
Int. Cl. C23b 9/00, 5/50, 3/00
U.S. Cl. 204—33 3 Claims

ABSTRACT OF THE DISCLOSURE

Use of an anodized aluminum mirror substrate as the base for a cryotron. The anodic coating of the mirror substrate is chemically stripped and then layers of superconducting films and gates are sequentially applied to the stripped surface. The whole structure can then be anodized. The substrate has an original surface roughness of less than 3 microinches.

Figure 1:
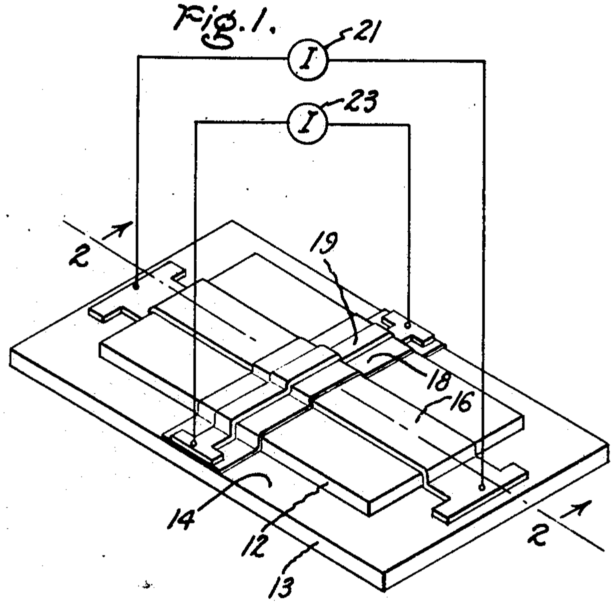

This invention relates to cryotrons and a method of forming cryotron ground planes. More particularly this invention relates to cryotrons having metallic substrates and to the formation of the cryotron ground plane by the deposition of a metal selected from the group consisting of niobium, tantalum and their superconductive alloys directly upon the polished surface of the metallic substrate.

When a current carrying thin film is switched to its normal state during cryotron operation by the application of a magnetic field, Joule heating results causing the film temperature to rise. Unless the generated heat is dissipated quickly to the liquid coolant in which the cryotron is immersed, the temperature of the film under prolonged switching can rise above its critical temperature thereby preventing the film from returning to its superconductive state at zero magnetic field. Prior attempts to increase the rate of heat transfer from a current carrying thin film to the liquid coolant have included the utilization of metallic substrates as a substitute for conventional glass substrates in order to benefit from the relatively high heat transfer coefficient of the metal. However, such prior metallic substrate devices generally have employed a non-metallic intermediate layer between the superconductive ground plane and the substrate in order to obtain a composite structure having suitable characteristics for utilization in a cryotron. Because such intermediate layers generally do not have the high thermal conductivity of metal, the rate of heat transfer from the cryotron to the coolant is limited.

It is therefore an object of this invention to provide a method of forming a cryotron ground plane by the deposition of a metal chosen from the group consisting of niobium, tantalum and their superconductive alloys directly upon a metallic substrate without the utilization of an intermediate layer.

It is a further object of this invention to provide an easily fabricated cryotron having a high thermal transfer coefficient.

These and other objects of this invention generally are accomplished by the deposition of a metal selected from the group consisting of niobium, tantalum and their superconducive alloys directly atop a highly smoothed metallic substrate. Thus at least a portion of a metallic substrate is smoothed by a conventional method, such as electro-polishing, rolling or buffing, with the polishing process employed primarily being determined by the specific metal chosen for the substrate. The polishing is continued until the substrate micro-roughness has been sufficiently smoothed, e.g. less than approximately 3 microinches C.L.A. (center line average) so that surface discontinuities do not inhibit proper electrical operation of a thin film deposited atop the substrate. A thin film of niobium, tantalum or their supercondutcive alloys then is deposited directly atop the polished metallic substrate to form the cryotron ground plane. After the completion of the deposition, the ground plane is coated with a layer of insulation and the remainder of the cryotron is constructed by the positioning of a superconductive gate conductor and a spaced apart control conductor atop the insulated ground plane.

Although aluminum generally is favored as the metallic substrate material because of its relatively low cost, high thermal conductivity and compatibility with the anodization process employed to form the ground plane insulation, other polishable, non-magnetic metals such as copper, tungsten, molybdenum, tantalum and zirconium having high thermal transfer coefficients also can be employed as support structures for the cryotron ground plane of this invention. Soft metals, such as lead, or reactive metals, such as sodium or potassium, generally are not suitable as substrate metals notwithstanding their high heat conductivity. Similarly, the economic cost and the polishing difficulties associated with zirconium, tungsten, molybdenum and tantalum make these metals less desirable as substrate metals than either aluminum or copper. Tin gate conductors have been found to exhibit both more uniform transition temperatures and narrower transition regions in cryotrons having aluminum substrates than in identical cryotrons having glass substrates.

Figure 3:
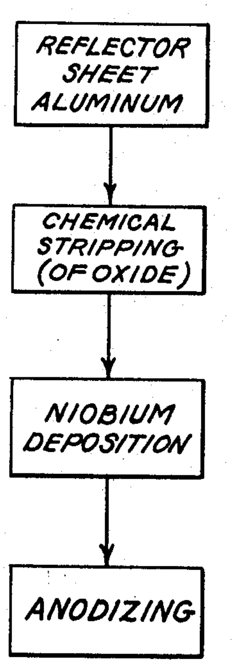
Figure 2:
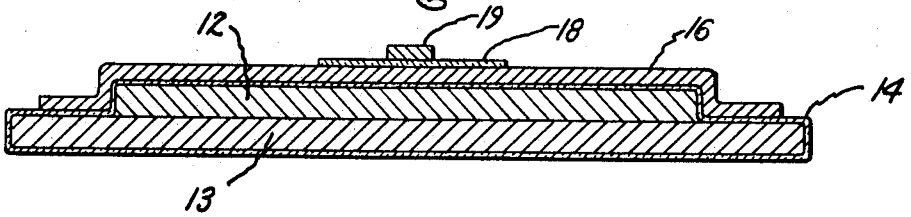
Figure 4:
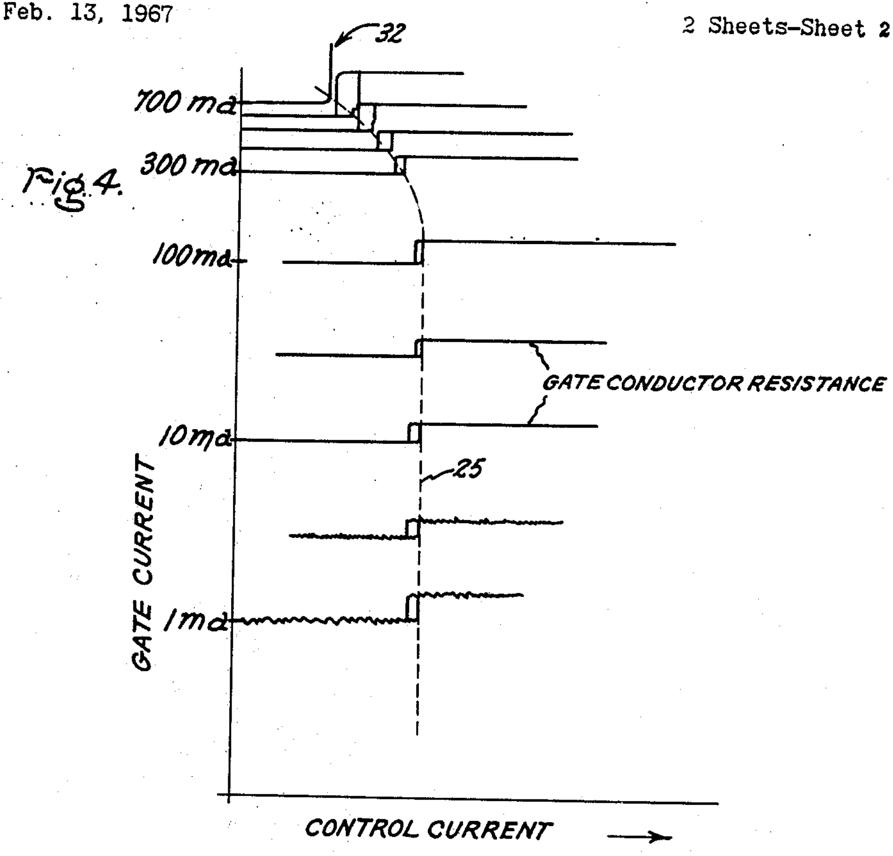
Figure 5:
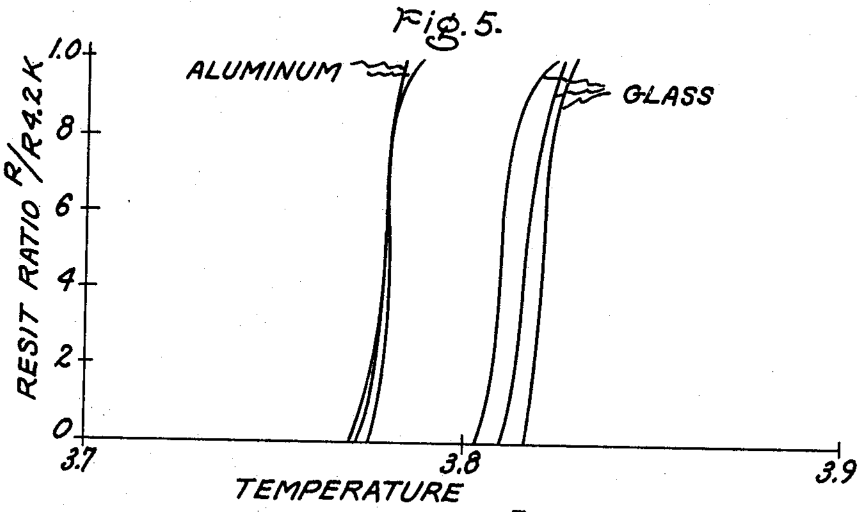

The features of this invention believed to be novel are set forth with particularity in the appended claims. The invention itself, however, both as to the organization and method of operation, together with further objects and advantages thereof, may best be understood by reference to the following description taken in connection with the accompanying drawings in which:

FIG. 1 is an isometric view of a cryotron circuit having a niobium ground plane deposited directly upon a polished metallic substrate, FIG. 2 is an enlarged sectional view taken along lines 2—2 of FIG. 1, FIG. 3 is a flow sheet portraying the method of this invention for forming a cryotron ground plane upon an aluminum substrate, FIG. 4 is a graph depicting gate conductor resistance in a cryotron having an aluminum substrate for various values of gate current and control current, and FIG. 5 is a graph depicting the variation of resistance ratio with temperature for tin gate conductors situated within cryotrons having aluminum and glass substrates respectively.

A cryotron circuit utilizing a metallic substrate is portrayed in FIGS. 1 and 2 and includes a metallic ground plane 12 chosen from the group consisting of niobium, tantalum and their superconductive alloys deposited upon a polished metallic substrate 13 having a surface microroughness preferably less than approximately 3 microinches C.L.A. (center line average). Niobium generally is preferred to tantalum as the ground plane material because of the relatively higher superconducting transition temperature of the niobium. The entire exposed surface of the juxtaposed ground plane and substrate is coated with an insulating layer 14, e.g. an anodic oxide or silicon monoxide, and a gate conductor 16 of a superconductive metal such as tin is positioned atop and extends longitudinally across the insulated surface of ground plane 12. An insulating layer 18 preferably of photoresist covers the top surface of gate conductor 16 remote from the ground plane and a control conductor 19 is situated upon insulating layer 18 at an orthogonal disposition with respect to gate conductor 16. The ends of both control conductor 19 and gate conductor 16 are widened relative to the respective widths of the conductors to facilitate the connection of the conductors to the terminals of control current source 23 and gate current source 21, respectively.

The method of forming a niobium ground plane 12 upon an aluminum substrate, which is preferred as the metallic substrate for the niobium ground plane principally because of its compatibility with the anodization process utilized to insulate the niobium, generally encompasses the chemical oxide stripping of an anodized aluminum reflector sheet to form a smooth surface for the subsequent direct deposition of the niobium ground plane as can be seen with reference to FIGURE 3.

Aluminum substrate 13 is prepared by cutting a commercially available, high smooth rolled and anodized aluminum specular reflector sheet of suitable thickness to the dimensions desired for the substrate. An aluminum reflector sheet suitable for utilization as the substrate material for this invention is manufactured by the Aluminum Company of America by a process which comprises the electrolytic brightening of rolled Alcoa reflector sheet and the subsequent anodic oxidization of the bright aluminum surface to produce a hard, adherent protective coating of aluminum oxide. The anodized sheet has a reflectivity as high as 85.5% and primarily is utilized in lighting. A more complete description of the properties of the reflector sheet can be obtained from form 31–11962, A.I.A. File No. 31–F–2–4 entitled "Alcoa Lighting Sheet" and form 31–11892, A.I.A. File No. 31–F–2–4 entitled "Alzak Processed Reflectors," both printed by the Aluminum Company of America. The oxidized aluminum reflector sheet is submerged within a chemical solution to strip the oxide layer from the underlying unoxidized aluminum. One chemical solution suitable for this oxide removal is a mixture of chromium oxide, phosphoric acid and water. It generally has been found that a surface roughness of less than approximately 3.0 microinches C.L.A. is a sufficiently smooth surface to accept a direct deposition of niobium ground plane 12. Other polishing methods which can produce a surface smoothness of less than approximately 3 microinches often are more favorably utilized with metallic substrates other than aluminum, e.g. copper, not being readily oxidizable, preferably is polished either by rolling or buffing.

After the aluminum substrate has been oxidized, polished, rinsed with distilled water and dried, it is positioned within a vacuum chamber for the deposition of niobium ground plane 12 upon its polished surface. The deposition preferably is performed by electron beam evaporation of an ingot of niobium or its superconducting alloys and is continued until a film having a thickness of approximately 1 micron has been deposited atop the smooth aluminum substrate. After cooling, the composite ground plane and substrate are removed from the vacuum chamber to be insulated in the preparation of the cryotron.

The preferred method of insulating the deposited niobium ground plane is by electrolytically anodizing the composite structure in an aqueous solution, e.g. ammonium pentoborate, ethylene glycol and water, to form a dense, chemically-resistant surface oxide. Both substrate 13 and ground plane 12 are submerged within the electrolytic solution and a potential of approximately 75 volts is applied to the composite unit to form an oxide layer 14 of approximately 1500 A. upon the upper surface of the deposited niobium film remote from substrate 11. Because the aluminum substrate can be anodized without seriously affecting its functioning as a medium for transfer of heat to the bath in which the cryotron is immersed during operation, no precautions are required to mask the aluminum substrate during the electrolytic anodization. The portion of the aluminum substrate underlying the deposited ground plane is shielded by the ground plane from contact with the anodizing solution and therefore remains unoxidized to assure a minimum distribution in heat transfer at the interface between ground plane 12 and substrate 13. If it is found necessary to further reduce the capacitance of the anodic insulation which will separate ground plane 12 from the remainder of the structure which comprises the cryotron, an insulating layer of silicon monoxide can be deposited over the metallic oxide by vacuum evaporation.

In a preferred method of fabricating the cryotron of this invention, a 1 inch x 3 inch rectangular substrate is cut from 0.032 inch thick piece of Alcoa specular lighting sheet aluminum obtained from the Edgcomb Steel Company, Milford, Conn. The sheet aluminum, as purchased, is coated with an anodic oxide layer and is highly polished to produce a surface roughness of less than 3 microninches C.L.A. when the oxide layer is chemically stripped from the substrate. The oxidized substrate is immersed within a mixture of 20 g. chromium oxide, 35 ml. phosphoric acid and 1 liter distilled water at the boiling temperature of the solution to chemically strip the oxide layer from the substrate. The substrate then is removed from the chemical stripping solution, rinsed with distilled water, air dried at an elevated temperature of 50° C., and placed in a vacuum chamber for the deposition of a 1 micron thick niobium ground plane by vacuum evaporation.

Upon completion of the deposition, the composite ground plane and substrate is removed from the vacuum chamber, connected to a 75 v. D.C. electrical potential and submerged in a bath of 156 g. ammonium pentoborate, 1124 ml. ethylene glycol and 760 ml. water at a bath temperature of 120° C. to form a 1500 A. layer of niobium oxide. The composite ground plane and substrate is rinsed in distilled water upon removal from the bath of ammonium pentoborate, ethylene glycol and water and again is placed in a vacuum chamber for the deposition of a 4000 A. thick layer of tin through a stencil to form the gate conductor. After coating a layer of photoresist atop the gate conductor, a lead film is deposited and etched in a solution of 200 cc. glacial acetic acid, 50 cc. hydrogen peroxide and 750 cc. water to form the control conductor at an orthogonal relationship with the gate conductor.

The suitability of the smoothed aluminum substrate 13 for cryotron operation was demonstrated by connecting gate current source 21 and control current source 23 across gate conductor 16 and control conductor 19, respectively, and plotting a graph, depicted in FIG. 4, of gate conductor resistance against control current. In testing the operation of the cryotron, the magnitude of the gate current was set at various fixed values while the magnitude of the control current was increased gradually to a value sufficient to normalize a portion of gate conductor 16 and then decreased to return the gate conductor to its superconducting state. Because the critical control currents between switching operations did not deviate for the critical current for a control conductor of the dimension etched (as depicted by generally vertical line 25), due to flux being trapped within the ground plane under the control conductor, the aluminum substrate was demonstrated to be sufficiently smooth for incorporation into a cryotron.

Furthermore it will be noted from curve 32 of FIG. 4 that thermal propagation of the normal region under control conductor 19 produced by appreciable Joule heating of gate conductor 16 occurred with a gate current of approximately 700 ma. This is considerably in excess of approximately 300 ma. at which thermal propagation occurs utilizing an identical cryotron on a glass substrate. The large discrepancies in the gate current for thermal propagation between a cryotron using a metallic substrate and an identical cryotron using a glass substrate presumably is due to the fact that a poor heat-conducting substrate such as glass cannot conduct an appreciable quantity of the heat produced by the gate conductor to the bath.

Similarly, prolonged switching of gate conductor 16 to the normal state can raise the temperature of portions of a heat retaining ground plane in intimate contact with the gate conductor significantly above the bath temperature and it becomes easier for the magnetic field which is associated with the current through the gate conductor to penetrate into the heated ground plane. When the gate current is turned off, the ground plane again cools to the bath temperature trapping the flux and firmly locking it in place. The gate conductor upon subsequent switching is in the presence of trapped flux rather than in a zero field as it was initially and therefore the critical control current required for switching is lower than the critical control current without an external field, a phenomenon called critical current cave-in. The flux trapped in the ground plane due to critical current cave-in generally can only be removed by heating the ground plane above its transition temperature. The relatively higher heat transfer coefficient of a metallic substrate, however, permits a rapid conduction of the heat within the ground plane to both the substrate and the liquid bath. A ground plane positioned directly upon a metallic substrate therefore is maintained at a relatively cooler temperature for a fixed gate current than cryotrons having glass substrates. Thus, less flux will penetrate and become trapped on a ground plane on a metallic substrate and critical current cave-in does not occur until the gate current is approximately double the critical current cave-in value of 300 ma. for a cryotron circuit having a glass substrate. Similarly the higher heat conductivity of the metallic substrates permits higher repeat rates and smaller cycle times for cryotrons deposited upon metallic substrates.

An added advantage of utilizing an aluminum substrate can be seen with reference to FIG. 5 which depicts the variation of resistance ratio with temperature for tin gate conductors positioned atop niobium ground planes deposited upon both aluminum and glass substrates. Three samples of each substrate were chosen and the tin gate conductors were positioned atop the oxide insulation of niobium ground planes formed by the method previously described with reference to FIG. 3. A measurement of resistance ratio, e.g. the resistance of the sample as the temperature of the sample is reduced below 4.2° K. to the resistance of the sample at 4.2° K., was made and plotted against temperature to determine the transition temperatures for each of the samples. As will be noted with reference to FIG. 5, the transition temperatures of the samples of tin gate conductors having aluminum substrates are considerably more uniform and have much narrower transition regions than tin gate conductors in cryotrons having glass substrates. The critical temperature of the tin films deposited on glass substrates however varied considerably between samples.

Presumably this results from the fact that the average coefficient of expansion of tin is approximately 20 while the coefficients of expansion of aluminum and glass are 18.35 and 8.15, respectively. Because the niobium ground planes are thin relative to the substrates upon which they are deposited, the ground planes generally follow the variations in dimensions of the thicker substrate material upon temperature fluctuation. Thus, as the temperature of the aluminum substrate is varied, the dimensional changes in the tin gate conductors are almost identical with the dimensional changes of the aluminum substrates thereby producing a minimum of stress within the tin gate conductors. Because the transition temperatures of the superconductive gate conductors vary with the applied mechanical stress, the transition temperatures of the tin gate conductors in the cryotrons having aluminum substrates are relatively uniform and exhibit narrow transition regions. An alteration in the temperature of the glass substrate and the overlying tin gate conductors however produces a relatively large divergence in the respective dimensions of the tin and glass thereby producing a relatively large stress within the tin gate conductors. The stresses produced in the tin gate conductors by the dimensional changes of the glass relative to the tin with temperature fluctuations results in large variations in the critical temperature of tin gate conductors in cryotrons having glass substrates as portrayed in FIGURE 5.

While several examples of this invention have been shown and described, it will be apparent to those skilled in the art that many changes and modifications may be made without departing from this invention in its broader aspects; and therefore the appended claims are intended to cover all such changes and modifications as fall within the true spirit and scope of this invention.

What we claim as new and desire to secure by Letters Patent of the United States is:

1. A method of forming a superconductive cryotron which comprises smoothing at least a portion of a rolled aluminum sheet to a roughness less than approximately 3 microinches C.L.A., said smoothing including the chemical stripping of an anodic surface layer from the aluminum sheet, depositing a film of a superconductive metal chosen from the group consisting of niobium, tantalum and their superconductive alloys directly atop the smooth surface of said aluminum sheet, forming an electrically insulating coating atop said superconductive film, and sequentially depositing a superconductive gating conductor and a spaced apart control conductor atop said insulating coating, said control conductor being orthogonally disposed relative to said underlying gating conductor.

2. A method of forming a superconductive cryotron according to claim 1 wherein said gating conductor is tin.

3. A method of forming a superconductive cryotron according to claim 1 wherein said insulating coating is formed by anodization of the superconductive film-aluminum sheet laminar structure.

References Cited

UNITED STATES PATENTS

| | | | |
|---|---|---|---|
| 3,187,235 | 6/1965 | Berlincourt et al. | 317—158 |
| 3,197,391 | 7/1965 | Bowers | 204—33 |
| 3,284,324 | 11/1966 | Appel et al. | 204—38 |
| 3,285,836 | 11/1966 | Maissel et al. | 204—15 |
| 3,332,047 | 7/1967 | Borchert | 335—216 |
| 3,366,728 | 1/1968 | Garwin et al. | 174—126 XR |

OTHER REFERENCES

Cline et al.: Journal of Applied Physics, vol. 37, No. 1, January 1966, pp. 5–8.

JOHN H. MACK, Primary Examiner

W. B. VANSISE, Assistant Examiner

U.S. Cl. X.R.

29—197, 599; 117—213; 156—3, 22; 174—126; 204—19, 40, 42